(12) United States Patent
Choi et al.

(10) Patent No.: US 6,181,136 B1
(45) Date of Patent: Jan. 30, 2001

(54) METHOD OF MANUFACTURING THE HUMAN TISSUE PHANTOMS FOR EVALUATION OF ELECTROMAGNETIC WAVE ENVIRONMENT

(75) Inventors: Hyung Do Choi, Seoul-Shi; Kwang Yun Cho; Jong Suk Chae, both of Daejon-Shi; Ho Gyu Yoon, Seoul-Shi, all of (KR)

(73) Assignee: Electronics and Telecommunications Research Institute, Daejon-shi (KR)

( * ) Notice: Under 35 U.S.C. 154(b), the term of this patent shall be extended for 0 days.

(21) Appl. No.: 09/177,539

(22) Filed: Oct. 23, 1998

(30) Foreign Application Priority Data

Oct. 24, 1997 (KR) .................................. 97-54791

(51) Int. Cl.⁷ ....................................... G01V 3/00
(52) U.S. Cl. ...................... 324/318; 324/308; 436/173
(58) Field of Search .................... 324/318, 308, 324/309, 307, 300; 436/173

(56) References Cited

U.S. PATENT DOCUMENTS

| | | | |
|---|---|---|---|
| 4,719,406 | * | 1/1988 | Schaefer et al. ...................... 324/318 |
| 5,023,185 | * | 6/1991 | Nambu et al. ............................ 436/8 |
| 5,246,000 | | 9/1993 | Ellis et al. .............................. 607/27 |
| 5,312,755 | | 5/1994 | Madsen et al. ........................... 436/8 |

FOREIGN PATENT DOCUMENTS 0 243 864 * 11/1987 (EP) ................ G01V/3/00
0702932A2 3/1996 (EP) .

OTHER PUBLICATIONS

M.A. Stuchly et al., Dielectric Properties of Biological Substances—Tabulated * Journal of Microwave Power, 15 (1), 1980, pp. 19–26.

Hiroshi Tamura, et al., "A Dry Phantom Material Composed of Ceramic and Graphite Power" IEEE Transactions on Electromagnetic Compatibility, vol. 39, No. 2 May 1997, pp. 132–137.

Arthur W. Guy, et al., "Analyses of Electromagnetic Fields Induced in biological Tissues by Thermographic Studies on Equivalent Phantom Models", IEEE Transactions on Microwave Theory and Techniques, vol. MTT–19, No. 2, Feb. 1971, pp. 205–214.

* cited by examiner

Primary Examiner—Christine K. Oda
Assistant Examiner—Brij B. Shrivastav
(74) Attorney, Agent, or Firm—Cohen, Pontani, Lieberman & Pavane

(57) ABSTRACT

The present invention relates to a method of manufacturing a human tissue phantom for evaluation of electromagnetic wave environment. The present invention suggests the human tissue phantom having reproducibility, being different from liquid type, after elapse of a certain period and preventing the air-gap occurring after insertion of probe, by using a composite material which is composed of a shape memory polymer as a base material and a dielectric material and a conductive material as the fillers, and also suggests the method of manufacturing the whole human body phantom.

6 Claims, 3 Drawing Sheets

METHOD OF MANUFACTURING THE HUMAN TISSUE PHANTOMS FOR EVALUATION OF ELECTROMAGNETIC WAVE ENVIRONMENT

BACKGROUND OF THE INVENTION

1. Field of the Invention

The present invention relates to a method of manufacturing the human tissue phantoms for evaluation of electromagnetic wave environment.

2. Information Disclosure Statement

Recently, the concerns have grown increasingly about EMI, EMS, and the effect on human body of electromagnetic wave radiation from electronics and telecommunication devices. Especially, the influence of the electromagnetic wave radiated from portable and mobile devices on the human body is one of very sensitive matters since it has direct relation not only with the telecommunication industry but also with national health. Human tissues may be accidentally or intentionally exposed to electromagnetic sources, such as a radar, electromagnetic oven, industrial microwave equipment, etc. There are still unclear things about the effects of electromagnetic exposure on human body. Therefore, the research on these effects is an important subject which mankind has to solve.

Knowing dielectric characteristics of biological tissue provides very important values in examining specific absorption rate (SAR) and its distribution of biological system, therefore, the characteristics of each tissue has been obtained through experiment or methods have been developed of estimating electrical characteristics of biological tissue by making a human tissue phantom with a mixture of a variety of dielectrics. The human tissue phantom is used in examining EM wave dictribation inside a human body, is used in examining and analyzing the SAR of the human tissue and is usefully used in development of RF and microwave hyperthermia equipment.

It is an object of the present invention to develop a shape memory human tissue phantom for evaluation of electromagnetic wave environment and to provide a method of manufacturing the whole body phantom to provide an evaluation guide of analysis of the effects of electromagnetic field on the human body.

Human tissue phantom of liquid or semiliquid type had been mainly used until 1980s, and these materials are of liquid or semiliquid type, easy to use and have no limitation in places of measurement so they have been widely used. However, there have been same problems of reproducibility due to electromagnetic characteristics change of materials since the type of liquid or semiliquid make it difficult to measure the specific absorption rate at liquid surface and to maintain continuously the constitutional component of material due to dehydration and in vasion of vacteria over time. Therefore, there were high possibility of occurrence of measurement error in analyzing the influences of portable phones, etc.

To avoid this, the new material of human tissue phantom has been researched and reported in 1990s. The human tissue phantom using a ceramic composite material and a polymer composite material were developed to complement the disadvantage of the liquid or semiliquid type. However, in the case of a solid type, although the measurement of specific absorption rate at the phantom surface was easy, the reliability of measurement was decreased due to a problem of air-gap between a probe and a hole at the measurement of the SAR distribution and the specific absorption rate inside the material. For these reasons, up to date, CENELEC and FCC have used the human tissue phantom of liquid or semiliquid type at the time of research of the estimation of specific absorption rate and electromagnetic wave distribution.

SUMMARY OF THE INVENTION

Therefore, it is an object of the present invention to develop the phantom of human tissue to provide an evaluation guide of analysis of influences of electromagnetic wave on the human tissue and to develop a total human tissue phantom which makes possible an analysis of influences of electromagnetic wave of varions equipment on each portion of human tissue by suggesting the human tissue phantom which can overcome the disadvantage of human tissue phantom of liquid and semiliquid type, and by suggesting a whole human body phantom.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DETAILED DESCRIPTION OF THE INVENTION

A detailed description of the present invention will be given below with reference to the accompanying drawings.

FIGS. 1(a) through 1(d) illustrate the method of manufacturing the shape memory human tissue phantom for evaluation of electromagnetic wave environment according to the present invention.

Figure 1A:
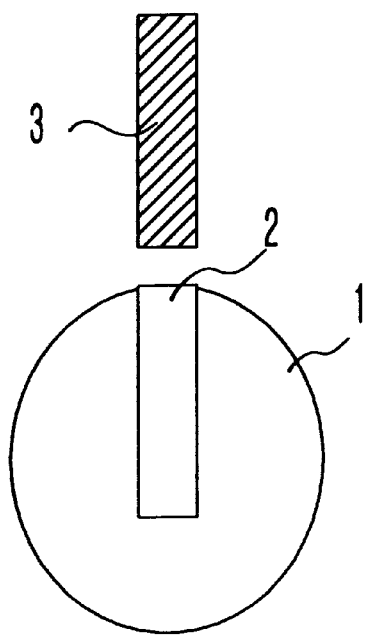
FIGS. 1(a) through 1(d) are sectional drawings showing a method of manufacturing the shape-memory human tissue phantom for evaluation of electromagnetic wave environment according to the present invention.
Figure 1B:
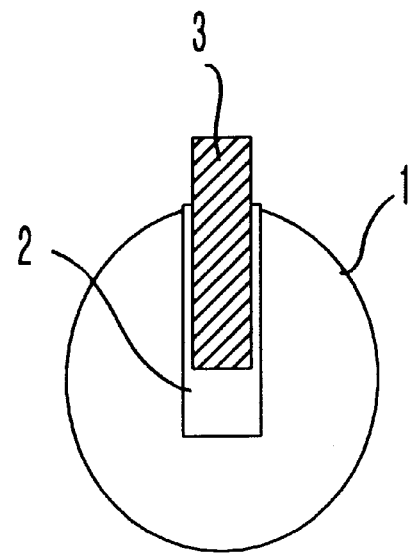
Figure 1C:
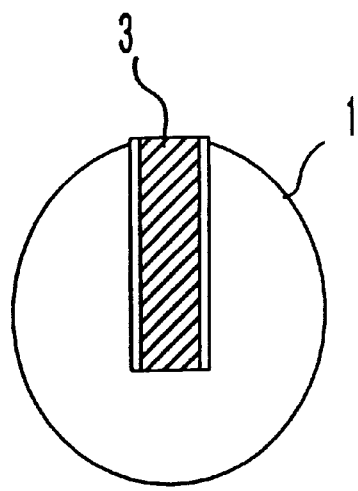
Figure 1D:
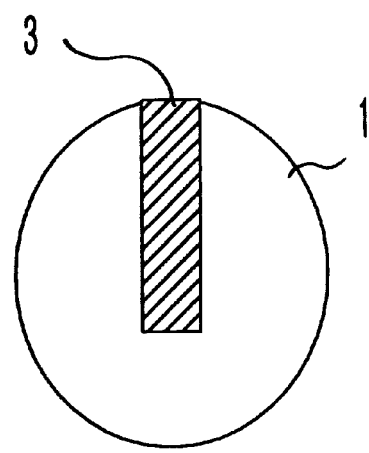

FIG. 1(a) is a sectional drawing showing a condition in which the human tissue phantom 1 is manufactured with a shape memory composite material and a probe hole 2 is formed to be 5% smaller than the size of a probe 3. A shape memory composite material can be used the shape memory polymer as a base material and has the relative permittivity and conductivity same as those of the human tissue and the memory characteristics by composing a composite material by adding the dielectric material and conductive material as fillers into the shape memory polymer. Copolymers of polynorborene, trans-polyisoprene, polyurethane, XLPE and styrene-butadiene are used as the shape memory polymer in the shape memory human body phantom 1 to order to obtain flexibility and memory characteristics, the dielectrics of $SrTiO_3$, $BaTiO_3$, $MgTiO_3$ and $CaTiO_3$, etc. are added as the filler material to control the relative permittivity, and the conductive materials of metal powder such as Cu, Al, Ag, Ni and Fe, etc., metal fiber, carbon fiber and carbon black, etc. are appropriately added to adjust the conductivity. These composite materials are mixed with two rolls and is manufacture into a primary formed body having the same shape as the human tissue and having the probe insertion hole 2.

Forming the probe hole 2 to be smaller than that of the probe 3 is for the purpose of removing the air gap between the probe 3 and human tissue phantom 1 by using the memory characteristics of the shape memory polymer at the time of insertion of the probe 3.

FIG. 1(*b*) is a sectional drawing showing a condition in which the probe 3 is freely inserted into the probe hole 2 of the human tissue phantom 1 by applying an appropriate stress.

FIG. 1(*c*) is a sectional drawing showing a condition in which the probe 3 is inserted into the human tissue phantom 1 and is cooled.

FIG. 1(*d*) is a sectional drawing showing a condition in which the probe 3 is fixed in the primary forming condition by heating the human tissue phantom 1 composed of the shape memory composite material.

Figure 2:
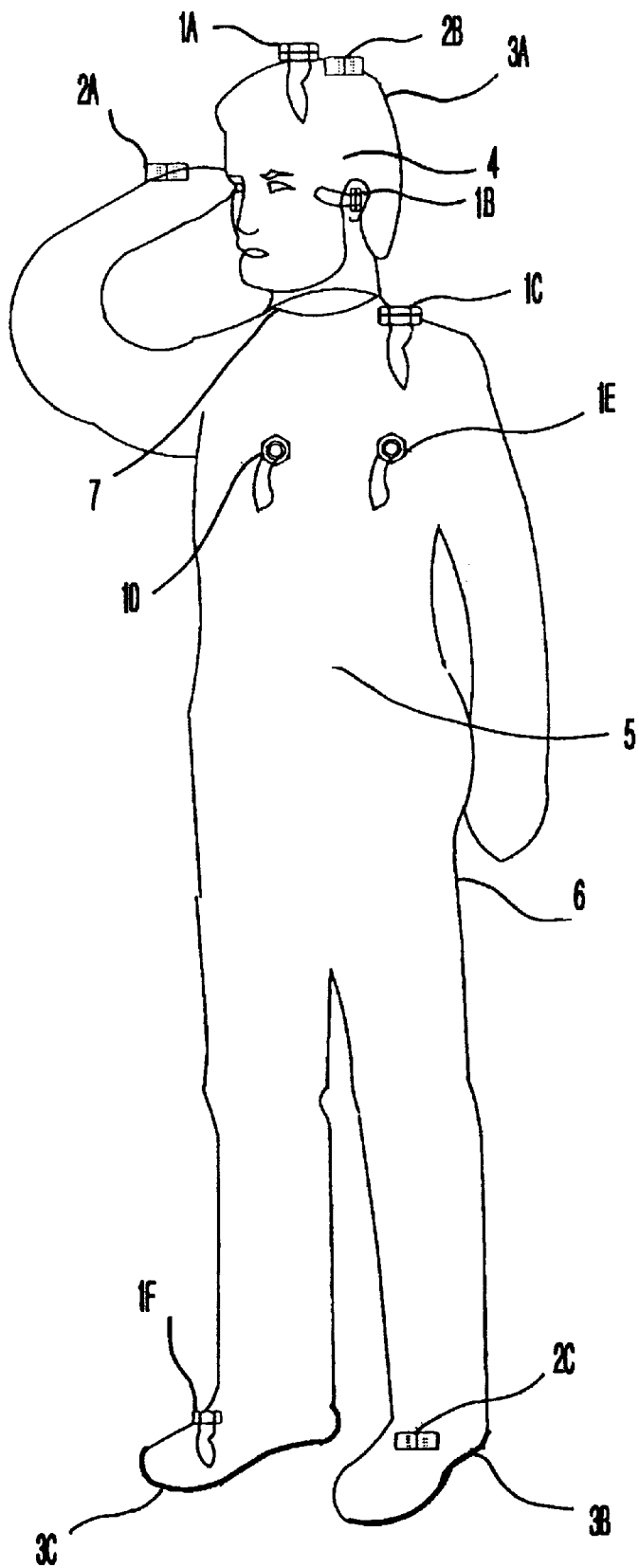
FIG. 2 is a construction drawing of a whole human tissue phantom for evaluation of electromagnetic environment suggested by the present invention.

FIG. 2 is a construction drawing of a whole human tissue phantom for evaluation of electromagnetic wave environment. The whole body phantom is divided into two parts, having as a center a theroplastic resin boundary portion 7 which forms a boundary portion between a body and a head, according to the interior solution. An entire human tissue phantom shell 6 is made of epoxy-fiberglass composite material, and a skin surface 3A of the head and a sole 3B, 3C of foot are coated with a composite material having an electric constant same as a skin tissue. The interior solution of the head is filled with a solution of brain tissue recommended by FCC and that of the body is filled with a solution having an electric constant number same as that of tissue of muscle or heart recommended by FCC.

Reference numbers 1A to 1F of FIG. 2 denote probe insertion portions which is composed of a silicon rubber portion for a contact and free movement between the probe and the solution, a sheet film portion for preventing the leakage of the liquid and the silicon rubber, and a connection screw portion. Reference numbers 1A and 1B of FIG. 2 denote the probe insertion portions for evaluation of the effects of electromagnetic wave on the head, and the probe insertion portions for evaluation of the influence on the heart are fitted on the back 1D, 1E and the shoulder 1C. The probe insertion portion for evaluation of the influence on the ankle and the foot is designated by 1F in FIG. 2.

Reference numbers 2A to 2C of FIG. 2 denote cleaning portions for insertion of the solution and for cleaning of inside. The cleaning portions are fitted at the wrist 2A, end of head 2B and the foot 2C for easy cleaning.

Figure 3A:
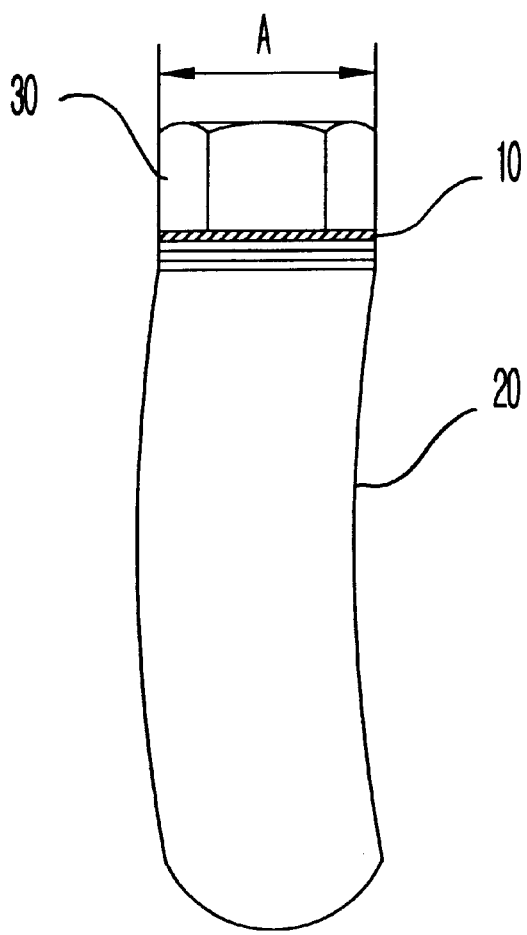
FIGS. 3(a) and 3(b) are detailed drawings of a probe insertion portion of the whole human tissue phantom suggested by the present invention.
Figure 3B:
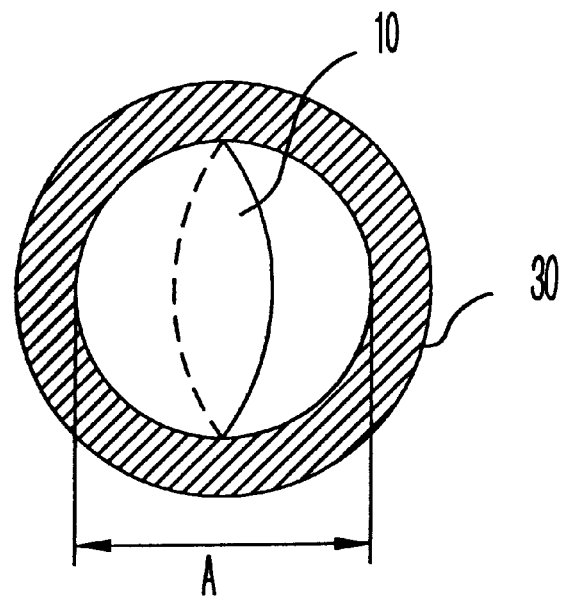

FIG. 3 shows a detailed drawing of the probe insertion portion. FIG. 3(*a*) shows a side view of the probe insertion portion, in which the reference number A denotes an insertion hole of same size as that of the probe, and the probe is inserted into the insertion hole A. Reference number 10 of FIG. 3(*a*) denotes a sheet film for prevention of leakage of the liquid and the silicon rubber. FIG. 3(*b*) shows a front view of the sheet film and the fixing screw. The sheet film is composed in such a way that the left side and right side of it are overlapped.

Reference number 20 of FIG. 3(*a*) denotes the silicon rubber which minimizes the boundary effect according to the contact between the probe and the interior solution and facilitates the free movement. Reference number 30 of FIG. 3(*a*) denotes a fixing screw for fixing the silicon rubber and the sheet film.

By constituting the present invention as described above, the problem of surface measurement and the decrease of reproducibility in the human tissue phantom of conventional liquid type can be solved and the problem of air-gap in the human tissue phantom of the solid type can be solved. The whole human body phantom can evaluate the effect of electromagnetic wave on each portion of human tissue by using only one phantom, can examine a ground effect, and also is useful in evaluating the influence of using position. Furthermore, thus manufactured human tissue phantom can be precisely, used in examining not only the influences of the surface but also inside the phantom in examining the influences of electromagnetic wave by portable phone.

The human tissue phantom using the composite material according to the present invention as described above is a phantom which can complement the human tissue phantom of liquid type and semiliquid type for estimation of SAR. The total human tissue phantom can analyses the influence of contact current and the influence on the tissue such as heart, etc. and provides very useful data not only to private or official research institutes but also to manufacturers which examine the influences of the electromagnetic hold on the human body.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a shape memory human tissue phantom for evaluation of an electromagnetic wave environments comprising the steps of:

forming a probe hole that is 5% lower than a size of a probe of said human tissue phantom after forming said human tissue phantom by adding a dielectric material and a conductive material as fillers for electric characteristics of human tissue to a shape memory polymer which is a base material;

inserting said probe through said probe hole by applying a stress to said human tissue phantom;

cooling said human tissue phantom after inserting said probe; and fixing said probe in a primacy forming condition, which condition said human tissue phantom memorizes, by heating said human tissue phantom.

2. The method as set forth in claim 1, wherein said shape memory polymer comprises one of a group of copolymers consisting essentially of polynorboene, transpolyisoprene, polyurethane, XLPE and styrene-butadiene.

3. The method as set forth in claim 1, wherein said dielectric material comprises one of the group consisting essentially of BaTiO3, SrTiO3, CaTiO3 and MgTiO3.

4. The method as set forth in claim 1, wherein said conductive material comprises one of the group consisting essentially of metal powder, metal fiber, carbon fiber and carbon black.

5. A method of manufacturing a whole human tissue phantom, the whole human tissue phantom comprising a head, a body, a neck, a foot having a sole, a skin surface of the head, and a skin surface of the body, wherein the skin surface of the head comprises a composite material and the skin surface of the body comprises an epoxy-fiberglass composite material and wherein the head and the sole of the foot comprise the same material, comprising the steps of:

adding a conductive material and a dielectric material on an epoxy-fiberglass human tissue phantom shell;

filling the head with a liquid phantom solution;

fitting a sheet film to the neck to form a boundary between the body and the neck; and filling the body with a liquid solution having electrical characteristics the same as muscle and heart.

6. The method as set forth in claim 5, further comprising the steps of:

forming probe insertion portions in portions of whole human tissue phantom, said probe insertion portions comprising silicon rubber for contact with a probe and for free movement of the probe in the probe insertion portions, and a sheet film in engagement with the silicon rubber for preventing leakage of the silicon rubber; and fitting cleaning portions on the head, body and foot for inserting solutions in each portion of the phantom and for cleaning interior portions of the phantom.

* * * * *